United States Patent
Lee et al.

(10) Patent No.: US 7,865,809 B1
(45) Date of Patent: Jan. 4, 2011

(54) DATA ERROR DETECTION AND CORRECTION IN NON-VOLATILE MEMORY DEVICES

(75) Inventors: Charles C. Lee, Cupertino, CA (US); I-Kang Yu, Palo Alto, CA (US); Abraham Chih-Kang Ma, Fremont, CA (US); Ming-Shiang Shen, Taipei Hsien (TW)

(73) Assignee: Super Talent Electronics, Inc., San Jose, CA (US)

( * ) Notice: Subject to any disclaimer, the term of this patent is extended or adjusted under 35 U.S.C. 154(b) by 273 days.

(21) Appl. No.: 12/166,191

(22) Filed: Jul. 1, 2008

Related U.S. Application Data

(63) Continuation-in-part of application No. 11/739,613, filed on Apr. 24, 2007, and a continuation-in-part of application No. 11/657,243, filed on Jan. 24, 2007, which is a continuation-in-part of application No. 10/799,039, filed on Mar. 11, 2004, now abandoned, which is a continuation-in-part of application No. 12/017,249, filed on Jan. 21, 2008, now Pat. No. 7,827,348.

(51) Int. Cl.
*H03M 13/00* (2006.01)
(52) U.S. Cl. .................. 714/782; 714/781; 714/784
(58) Field of Classification Search .............. 714/781, 714/782, 784
See application file for complete search history.

(56) References Cited

U.S. PATENT DOCUMENTS

| | | | |
|---|---|---|---|
| 5,323,402 A * | 6/1994 | Vaccaro et al. ............. 714/782 |
| 5,428,628 A * | 6/1995 | Hassner et al. ............. 714/759 |
| 6,611,938 B1 | 8/2003 | Tanaka et al. |
| 6,640,327 B1 | 10/2003 | Hallberg |
| 6,856,660 B1 * | 2/2005 | Watanabe et al. .......... 375/364 |
| 6,954,892 B2 | 10/2005 | Lee et al. |
| 6,961,890 B2 | 11/2005 | Smith |
| 6,990,624 B2 * | 1/2006 | Dohmen et al. ............. 714/785 |
| 7,047,478 B2 | 5/2006 | Gregori et al. |
| 7,124,064 B1 * | 10/2006 | Thurston ...................... 703/2 |
| 7,206,992 B2 | 4/2007 | Xi |
| 7,210,077 B2 | 4/2007 | Brandenberger et al. |
| 7,219,285 B2 | 5/2007 | Tanaka et al. |
| 7,237,183 B2 | 6/2007 | Xin |
| 2003/0101406 A1 * | 5/2003 | Song ......................... 714/774 |

* cited by examiner

*Primary Examiner*—Sam Rizk
(74) *Attorney, Agent, or Firm*—Roger H. Chu

(57) ABSTRACT

Data error detection and correction in non-volatile memory devices are disclosed. Data error detection and correction can be performed with software, hardware or a combination of both. Generally an error corrector is referred to as an ECC (error correction code). One of the most relevant codes using in non-volatile memory devices is based on BCH (Bose, Ray-Chaudhuri, Hocquenghem) code. In order to correct reasonable number (e.g., up to 8-bit (eight-bit)) of random errors in a chunk of data (e.g., a codeword of 4200-bit with 4096-bit information data), a BCH(4200,4096,8) is used in $GF(2^{13})$. ECC comprises encoder and decoder. The decoder further comprises a plurality of error detectors and one error corrector. The plurality of error decoders is configured for calculating odd terms of syndrome polynomial for multiple channels in parallel, while the error corrector is configured for sequentially calculating even terms of syndrome polynomial, key solver and error location.

16 Claims, 20 Drawing Sheets

Elements of GF($2^4$) generated by $x^4 + x + 1$

| Power | Polynomial | Binary |
|---|---|---|
| 0 | 0 | 0000 |
| 1 | 1 | 0001 |
| $\alpha$ | $\alpha$ | 0010 |
| $\alpha^2$ | $\alpha^2$ | 0100 |
| $\alpha^3$ | $\alpha^3$ | 1000 |
| $\alpha^4$ | $\alpha + 1$ | 0011 |
| $\alpha^5$ | $\alpha^2 + \alpha$ | 0110 |
| $\alpha^6$ | $\alpha^3 + \alpha^2$ | 1100 |
| $\alpha^7$ | $\alpha^3 + \alpha + 1$ | 1011 |
| $\alpha^8$ | $\alpha^2 + 1$ | 0101 |
| $\alpha^9$ | $\alpha^3 + \alpha$ | 1010 |
| $\alpha^{10}$ | $\alpha^2 + \alpha + 1$ | 0111 |
| $\alpha^{11}$ | $\alpha^3 + \alpha^2 + \alpha$ | 1110 |
| $\alpha^{12}$ | $\alpha^3 + \alpha^2 + \alpha + 1$ | 1111 |
| $\alpha^{13}$ | $\alpha^3 + \alpha^2 + 1$ | 1101 |
| $\alpha^{14}$ | $\alpha^3 + 1$ | 1001 |

*FIG. 4A*

Elements of $GF(2^4)$ generated by $x^4 + x^3 + 1$

| Power | Polynomial | Binary |
|---|---|---|
| 0 | 0 | 0000 |
| 1 | 1 | 0001 |
| $\alpha$ | $\alpha$ | 0010 |
| $\alpha^2$ | $\alpha^2$ | 0100 |
| $\alpha^3$ | $\alpha^3$ | 1000 |
| $\alpha^4$ | $\alpha^3 + 1$ | 1001 |
| $\alpha^5$ | $\alpha^3 + \alpha + 1$ | 1011 |
| $\alpha^6$ | $\alpha^3 + \alpha^2 + \alpha + 1$ | 1111 |
| $\alpha^7$ | $\alpha^2 + \alpha + 1$ | 0111 |
| $\alpha^8$ | $\alpha^3 + \alpha^2 + \alpha$ | 1110 |
| $\alpha^9$ | $\alpha^2 + 1$ | 0101 |
| $\alpha^{10}$ | $\alpha^3 + \alpha$ | 1010 |
| $\alpha^{11}$ | $\alpha^3 + \alpha^2 + 1$ | 1101 |
| $\alpha^{12}$ | $\alpha + 1$ | 0011 |
| $\alpha^{13}$ | $\alpha^2 + \alpha$ | 0110 |
| $\alpha^{14}$ | $\alpha^3 + \alpha^2$ | 1100 |

*FIG. 4B*

Primitive Polynomials of GF($2^{13}$)

| 1 | $1 + x + x^3 + x^4 + x^{13}$ |
|---|---|
| 2 | $1 + x^4 + x^5 + x^7 + x^9 + x^{10} + x^{13}$ |
| 3 | $1 + x + x^4 + x^7 + x^8 + x^{11} + x^{13}$ |
| 4 | $1 + x + x^2 + x^3 + x^6 + x^8 + x^9 + x^{10} + x^{13}$ |
| 5 | $1 + x^5 + x^6 + x^7 + x^8 + x^{12} + x^{13}$ |
| 6 | $1 + x + x^5 + x^7 + x^8 + x^9 + x^{13}$ |
| 7 | $1 + x^3 + x^4 + x^5 + x^6 + x^{12} + x^{13}$ |
| 8 | $1 + x + x^2 + x^3 + x^4 + x^5 + x^7 + x^9 + x^{13}$ |

*FIG. 4C*

Generator Polynomial in $GF(2^{13})$
$m=13$, $t=4$ $1 + x + x^3 + x^5 + x^7 + x^9 + x^{10} + x^{15} + x^{16} + x^{17} + x^{19} + x^{21} + x^{23} + x^{24} + x^{25} + x^{30} + x^{36} + x^{37} + x^{41} + x^{44} + x^{46} + x^{50} + x^{52}$

FIG. 4D

Generator Polynomial in $GF(2^{13})$
$m=13$, $t=8$ $1 + x + x^5 + x^8 + x^9 + x^{11} + x^{12} + x^{13} + x^{14} + x^{15} + x^{18} + x^{22} + x^{23} + x^{24} + x^{26} + x^{30} + x^{31} + x^{32} + x^{38} + x^{40} + x^{41} + x^{42} + x^{47} + x^{48} + x^{49} + x^{52} + x^{58} + x^{59} + x^{64} + x^{65} + x^{67} + x^{68} + x^{69} + x^{70} + x^{77} + x^{78} + x^{79} + x^{82} + x^{84} + x^{88} + x^{91} + x^{92} + x^{93} + x^{94} + x^{95} + x^{96} + x^{98} + x^{100} + x^{104}$

Full Loop Count Berlekamp-Massey

Example BCH(15,7,2) with two errors

Syndrome $S(x) = \alpha^{11}x^4 + \alpha^5 x^3 + \alpha^{13}x^2 + \alpha^{14}x$

900

| n | L ← n-L | δ ↓ $\Delta_n$ | $\Lambda(x)$ ← T(x) | D(x) ↓ $\Lambda(x)$ | $\Delta_n = \Sigma \Lambda_i * S_{n-i}$ | $T(x) = \delta*\Lambda(x) + \Delta_n*D(x)$ |
|---|---|---|---|---|---|---|
| 0 | 0 | 1 | 1 | x | | |
| 1 | 1 | $\alpha^{14}$ | $1 + \alpha^{14}x$ | 1 | $\Delta_1 = \Lambda_0 * S_1 = 1*\alpha^{14} = \alpha^{14}$ | $1*1 + \alpha^{14}*x = 1 + \alpha^{14}x$ |
| | | | | $1*x = x$ | | |
| 2 | | | | $x*x = x^2$ | $\Delta_2 = \Lambda_0*S_2 + \Lambda_1*S_1 = 1*\alpha^{13} + \alpha^{14}*\alpha^{14} = \alpha^{13} + \alpha^{28} = \alpha^{13} + \alpha^{13} = 0$ | |
| 3 | 2 | $\alpha^{14}$ | $\alpha^{14} + \alpha^{13}x + \alpha^{14}x^2$ | $1 + \alpha^{14}x$ | $\Delta_3 = \Lambda_0*S_3 + \Lambda_1*S_2 = 1*\alpha^5 + \alpha^{14}*\alpha^{13} = \alpha^5 + \alpha^{27} = \alpha^{13} + \alpha^{12} = \alpha^{14}$ | $\alpha^{14}*(1+\alpha^{14}x) + \alpha^{14}*x^2 = \alpha^{14} + \alpha^{13}x + \alpha^{14}x^2$ |
| | | | | $x + \alpha^{14}x^2$ | | |
| 4 | | | | $x^2 + \alpha^{14}x^3$ | $\Delta_4 = \Lambda_0*S_4 + \Lambda_1*S_3 + \Lambda_2*S_2 = 0$ | |

FIG. 10

Half Loop Count Berlekamp-Massey

Example BCH(15,7,2) with two errors

Syndrome $S(x) = \alpha^{11}x^4 + \alpha^5 x^3 + \alpha^{13}x^2 + \alpha^{14}x$

1000

| n | L <br> ↓ n-L | δ ↓ <br> $\Delta_n$ | $\Lambda(x)$ ← T(x) | D(x) ← <br> $\Lambda(x)$ | $\Delta_n = \Sigma \Lambda_i * S_{n-i}$ | $T(x) = \delta * \Lambda(x) + \Delta_n * D(x)$ |
|---|---|---|---|---|---|---|
| -1 | 0 | 1 | 1 | x | | |
| 1 | 1 | $\alpha^{14}$ | $1 + \alpha^{14}x$ | 1 | $\Delta_1 = \Lambda_0 * S_1 = 1 * \alpha^{14} = \alpha^{14}$ | $1*1 + \alpha^{14}*x = 1 + \alpha^{14}x$ |
| 1 | 1 | | | $1* x^2 = x^2$ | | |
| 3 | 3 | | $\alpha^{14} + \alpha^{13}x + \alpha^{14}x^2$ | | $\Delta_3 = \Lambda_0 * S_3 + \Lambda_1 * S_2 = 1*\alpha^5 + \alpha^{14}*\alpha^{13} = \alpha^5 + \alpha^{27} = \alpha^{13} + \alpha^{12} = \alpha^{14}$ | $\alpha^{14}*(1+\alpha^{14}x) + \alpha^{14}*x^2 = \alpha^{14} + \alpha^{13}x + \alpha^{14}x^2$ |
| 3 | 2 | $\alpha^{14}$ | | $1 + \alpha^{14}x$ | | |
| 3 | 3 | | | $x^2 + \alpha^{14}x^3$ | | |

DATA ERROR DETECTION AND CORRECTION IN NON-VOLATILE MEMORY DEVICES

CROSS-REFERENCE TO RELATED APPLICATIONS

This application is a continuation-in-part (CIP) of U.S. patent application for "Electronic Data Flash Card with Reed Solomon Error Detection and Correction Capacity", Ser. No. 11/739,613, filed on Apr. 24, 2007.

This application is also a CIP of U.S. patent application for "Electronic Data Flash Card with Bose, Ray-Chaudhuri, Hocquenghem (BCH) Error Detection/Correction", Ser. No. 11/657,243, filed on Jan. 24, 2007, which is a CIP of U.S. patent application for "System and Method for Managing Blocks in Flash Memory", Ser. No. 10/799,039, filed on Mar. 11, 2004, now abandoned.

This application is also a CIP of U.S. patent application for "High Performance SSD", Ser. No. 12/017,249, filed on Jan. 21, 2008 now U.S. Pat. No. 7,827,348.

FIELD OF THE INVENTION

The invention relates to non-volatile memory devices, more particularly to data error detection and correction in non-volatile memory devices (NVMDs).

BACKGROUND OF THE INVENTION

Non-volatile memory (e.g., flash memory) based data storage devices have become mainstream in the past decade. Flash memories use non-volatile memory cells such as electrically-erasable programmable read-only memory, (EEPROM), but are not randomly accessible at the byte level. Instead, whole pages or sectors of 512 bytes or more are read or written together as a single page. NAND flash memory is commonly used for data storage of blocks. Pages in the same block may have to be erased together, and limitations on writing may exist, such as only being allowed to write each page once between erases.

Data transfer operations (e.g., read/write) are performed with electrical signals between host and NVMDs. Due to the nature of electrical signals may be lost or corrupted during data transmission. Therefore, data may contain random errors when stored or retrieved from non-volatile memory. There are many prior art approaches to overcome data error problems. One of which is to use error correction code (ECC) such that additional error correction information is carried along with the real data. However, the prior art approaches are very complicated hence expensive and not optimized. Therefore, it would be desirable to have an efficient and effective implementation of error correction to ensure data reliability of a non-volatile memory device (NVMD).

BRIEF SUMMARY OF THE INVENTION

This section is for the purpose of summarizing some aspects of the present invention and to briefly introduce some preferred embodiments. Simplifications or omissions in this section as well as in the abstract and the title herein may be made to avoid obscuring the purpose of the section. Such simplifications or omissions are not intended to limit the scope of the present invention.

Data error detection and correction in non-volatile memory devices are disclosed. According to one aspect, the data error detection and correction can be performed with software, hardware or a combination of both. Generally an error corrector is referred to as an ECC (error correction code). One of the most relevant codes using in NVMDs is based on BCH (Bose, Ray-Chaudhuri, Hocquenghem). In order to correct reasonable number (e.g., 8-bit (eight-bit)) of random errors in a chunk of data (e.g., a codeword of 4200-bit with 4096-bit information data), a BCH(4200,4096,8) is used in $GF(2^{13})$. ECC comprises encoder and decoder. The decoder further comprises a plurality of error detectors and one error corrector. The plurality of error decoders is configured for calculating odd terms of syndrome polynomial for multiple channels in parallel, while the error corrector is configured for sequentially calculating even terms of syndrome polynomial, key solver and error location.

According to another aspect, the key solver is based on an inversionless Berlekamp-Massey iterative method with half loop count. The error location and correction is based on a 'p'-way parallel Chien search.

According one embodiment, the present invention is a system for performing data error correction in a non-volatile memory device. The system comprises at least the following: a plurality of data error detectors each containing an odd-syndrome calculator, wherein the odd-syndrome calculator is configured for calculating odd terms of syndrome polynomial of a codeword; a multiplexer coupling to the plurality of data error detectors; and a data error corrector, coupling to the multiplexer, comprising an even-syndrome calculator, a key-solver and an error locator, wherein the even-syndrome calculator is configured for calculating even terms of the syndrome polynomial, wherein the key solver is configured for determining coefficients of error polynomial based on the odd and even terms of the syndrome polynomial, and wherein the error locator is configured for finding one or more locations of random data error using the coefficients of error location polynomial. The system further comprises at least one data encoder configured for encoding a chunk of data based on a predetermined coding scheme.

According another embodiment, the present invention is a method of performing data error correction in a non-volatile memory device. The method comprises at least the following: receiving a plurality of codewords each encoded with a predetermined coding scheme; calculating odd terms of syndrome polynomial of each of the codewords in parallel; determining whether said each of the codewords contains any data error; when said data error is found, sequentially calculating even terms of the syndrome polynomial corresponding to the odd terms of those of the codewords containing said data error; iteratively obtaining coefficients of error polynomial using the odd and even terms of the syndrome polynomial; locating at least one random error location in each of said those of the codewords containing said data error using Chien search logic; and correcting data error at the at least one random error location accordingly Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

FIGS. 4A-4B are tables listing elements of GF(16) generated by primitive polynomials;

FIG. 4C is a table listing exemplary primitive polynomials of $GF(2^{13})$;

FIGS. 4D-4E list generator polynomials for correcting four and eight maximum random errors in $GF(2^{13})$;

FIG. 9 is a table showing an example of detecting and correcting two errors using the process of FIG. 7;

FIG. 10 is a table showing an example of detecting and correcting two errors using the process of FIG. 8;

DETAILED DESCRIPTION

In the following description, numerous details are set forth to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Embodiments of the present invention are discussed herein with reference to FIGS. 1A-11. However, those skilled in the art will readily appreciate that the detailed description given herein with respect to these figures is for explanatory purposes as the invention extends beyond these limited embodiments.

Figure 1A:
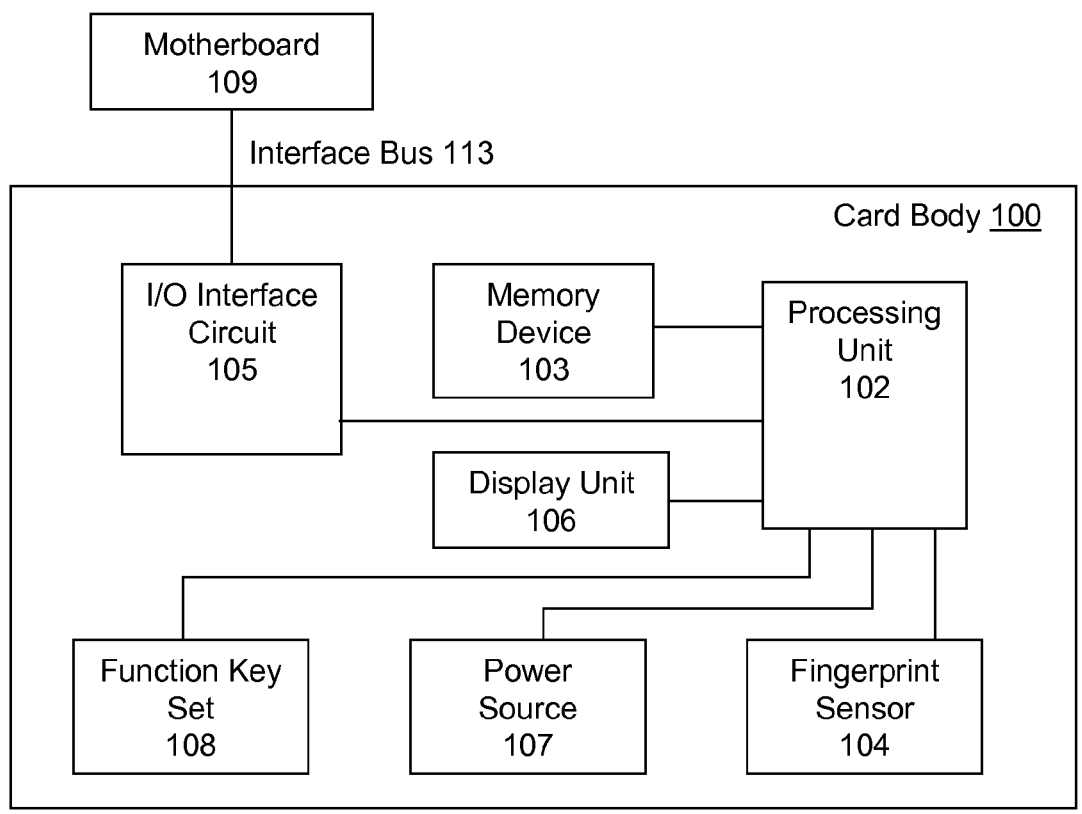
FIG. 1A is a block diagram showing salient components of a first flash memory device (with fingerprint verification capability), in which an embodiment of the present invention may be implemented.

FIG. 1A is a block diagram illustrating salient components of a first flash memory device (with fingerprint verification capability), in which an embodiment of the present invention may be implemented. The first flash memory device is adapted to a motherboard 109 via an interface bus 113. The first flash memory device includes a card body 100, a processing unit 102, memory device 103, a fingerprint sensor 104, an input/output (I/O) interface circuit 105, an optional display unit 106, an optional power source (e.g., battery) 107, and an optional function key set 108. The motherboard 109 may be a motherboard of a desktop computer, a laptop computer, a mother board of a personal computer, a cellular phone, a digital camera, a digital camcorder, a personal multimedia player or any other computing or electronic devices.

The card body 100 is configured for providing electrical and mechanical connection for the processing unit 102, the memory device 103, the I/O interface circuit 105, and all of the optional components. The card body 100 may comprise a printed circuit board (PCB) or an equivalent substrate such that all of the components as integrated circuits may be mounted thereon. The substrate may be manufactured using surface mount technology (SMT) or chip on board (COB) technology.

The processing unit 102 and the I/O interface circuit 105 are collectively configured to provide various control functions (e.g., data read, write and erase transactions) of the memory device 103. The processing unit 102 may also be a standalone microprocessor or microcontroller, for example, an 8051, 8052, or 80286 Intel® microprocessor, or ARM®, MIPS® or other equivalent digital signal processor. The processing unit 102 and the I/O interface circuit 105 may be made in a single integrated circuit, for application specific integrated circuit (ASIC).

The memory device 103 may comprise one or more non-volatile memory (e.g., flash memory) chips or integrated circuits. The flash memory chips may be single-level cell (SLC) or multi-level cell (MLC) based. In SLC flash memory, each cell holds one bit of information, while more than one bit (e.g., 2, 4 or more bits) are stored in a MLC flash memory cell. A detail data structure of an exemplary flash memory is described and shown in FIG. 4A and corresponding descriptions thereof.

The fingerprint sensor 104 is mounted on the card body 100, and is adapted to scan a fingerprint of a user of the first electronic flash memory device 100 to generate fingerprint scan data. Details of the fingerprint sensor 104 are shown and described in a co-inventor's U.S. Pat. No. 7,257,714, entitled "Electronic Data Storage Medium with Fingerprint Verification Capability" issued on Aug. 14, 2007, the entire content of which is incorporated herein by reference.

The memory device 103 stores, in a known manner therein, one or more data files, a reference password, and the fingerprint reference data obtained by scanning a fingerprint of one or more authorized users of the first flash memory device. Only authorized users can access the stored data files. The data file can be a picture file, a text file or any other file. Since the electronic data storage compares fingerprint scan data obtained by scanning a fingerprint of a user of the device with the fingerprint reference data in the memory device to verify if the user is the assigned user, the electronic data storage can only be used by the assigned user so as to reduce the risks involved when the electronic data storage is stolen or misplaced.

The input/output interface circuit 105 is mounted on the card body 100, and can be activated so as to establish communication with the motherboard 109 by way of an appropriate socket via an interface bus 113. The input/output interface circuit 105 may include circuits and control logic associated with a Universal Serial Bus (USB) interface structure that is connectable to an associated socket connected to or mounted on the motherboard 109. The input/output interface circuit 105 may also be other interfaces including, but not limited to, Secure Digital (SD) interface circuit, Micro SD interface circuit, Multi-Media Card (MMC) interface circuit, Compact Flash (CF) interface circuit, Memory Stick (MS) interface circuit, PCI-Express interface circuit, a Integrated Drive Electronics (IDE) interface circuit, Serial Advanced Technology Attachment (SATA) interface circuit, external SATA, Radio Frequency Identification (RFID) interface circuit, fiber channel interface circuit, optical connection interface circuit.

The processing unit 102 is controlled by a software program module (e.g., a firmware (FW)), which may be stored partially in a ROM (not shown) such that processing unit 102 is operable selectively in: (1) a data programming or write mode, where the processing unit 102 activates the input/output interface circuit 105 to receive data from the motherboard 109 and/or the fingerprint reference data from fingerprint sensor 104 under the control of the motherboard 109, and store the data and/or the fingerprint reference data in the memory device 103; (2) a data retrieving or read mode, where the processing unit 102 activates the input/output interface circuit 105 to transmit data stored in the memory device 103 to the motherboard 109; or (3) a data resetting or erasing mode, where data in stale data blocks are erased or reset from the memory device 103. In operation, motherboard 109 sends write and read data transfer requests to the first flash memory device 100 via the interface bus 113, then the input/output interface circuit 105 to the processing unit 102, which in turn utilizes a flash memory controller (not shown or embedded in the processing unit) to read from or write to the associated at least one memory device 103. In one embodiment, for further security protection, the processing unit 102 automatically initiates an operation of the data resetting mode upon detecting a predefined time period has elapsed since the last authorized access of the data stored in the memory device 103.

The optional power source 107 is mounted on the card body 100, and is connected to the processing unit 102 and other associated units on card body 100 for supplying electrical power (to all card functions) thereto. The optional function key set 108, which is also mounted on the card body 100, is connected to the processing unit 102, and is operable so as to initiate operation of processing unit 102 in a selected one of the programming, data retrieving and data resetting modes. The function key set 108 may be operable to provide an input password to the processing unit 102. The processing unit 102 compares the input password with the reference password stored in the memory device 103, and initiates authorized operation of the first flash memory device 100 upon verifying that the input password corresponds with the reference password. The optional display unit 106 is mounted on the card body 100, and is connected to and controlled by the processing unit 102 for displaying data exchanged with the motherboard 109.

Figure 1B:
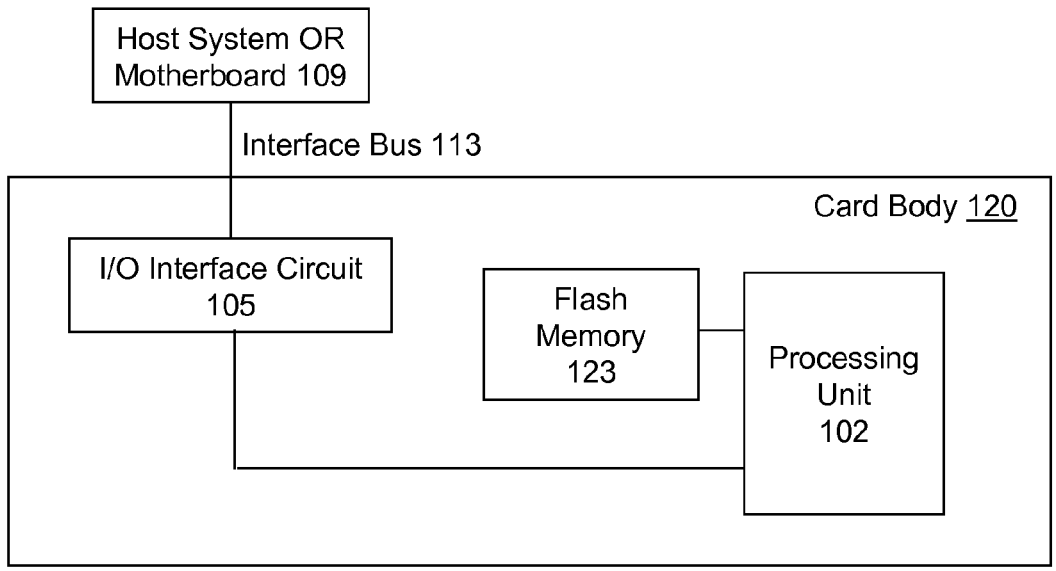
FIG. 1B is a block diagram showing salient components of a second flash memory device (without fingerprint verification capability), in which an embodiment of the present invention may be implemented.

A second flash memory device (without fingerprint verification capability) is shown in FIG. 1B. The second flash memory device includes a card body 120 with a processing unit 102, an I/O interface circuit 105 and at least one flash memory chip 123 mounted thereon. Similar to the first flash memory device, the second flash memory device couples to a motherboard or a host computing system 109 via an interface bus 113. Fingerprint functions such as scanning and verification may be handled by the host system 109.

Figure 1C:
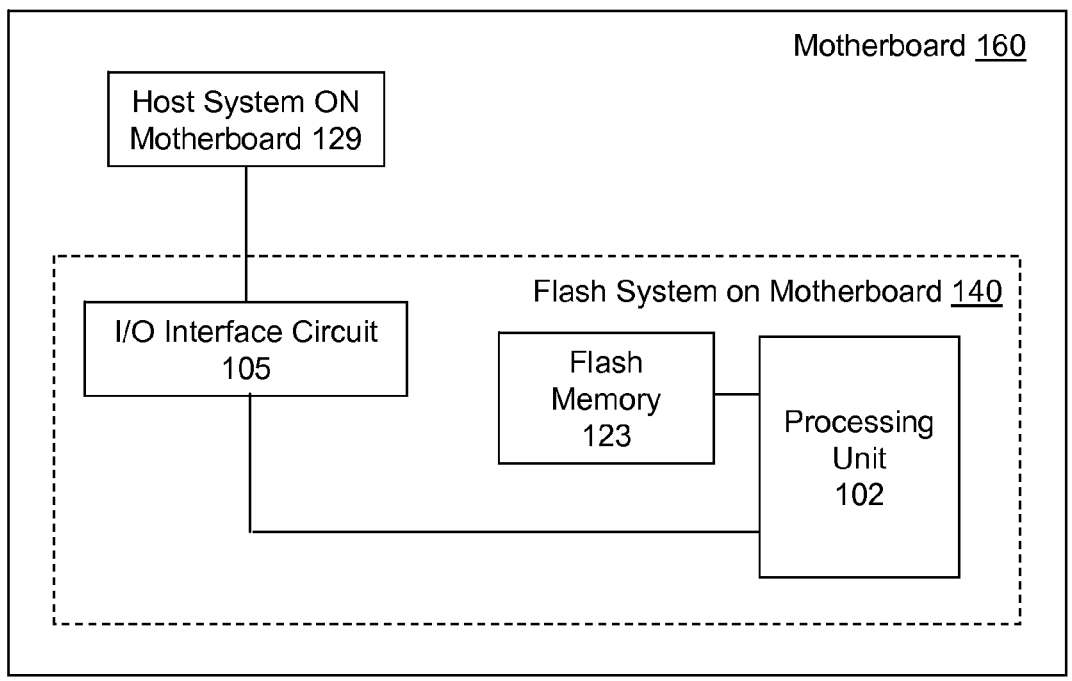
FIG. 1C is a block diagram showing salient components of a flash memory system embedded on a motherboard, in which an embodiment of the present invention may be implemented.

FIG. 1C shows a flash memory system 140 integrated with a motherboard 160. Substantially similar to the second flash memory device 120 for FIG. 1B, the flash system 140 contains a processing unit 102, an I/O interface circuit 105 and at least one flash memory chip 123. Included on the motherboard 160, there is a host system 129 and the flash system 140. Data, command and control signals for the flash system 140 are transmitted through an internal bus.

Figure 1D:
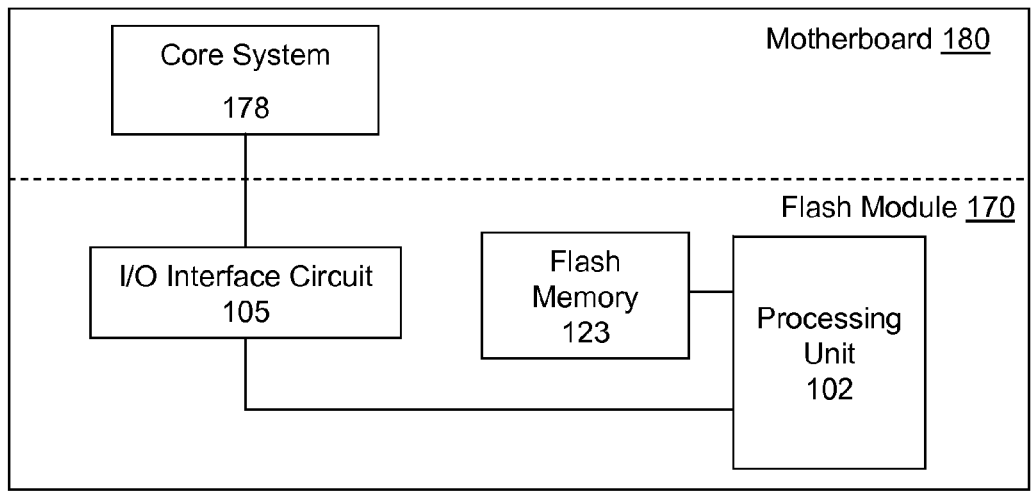
FIG. 1D is a block diagram showing salient components of a flash memory module coupling to a motherboard, in which an embodiment of the present invention may be implemented.

FIG. 1D shows a flash memory module 170 coupling to a motherboard 180. The flash memory module 170 comprises a processing unit 102 (e.g., a flash controller), one or more flash memory chips 123 and an I/O interface circuit 105. The motherboard 180 comprises a core system 178 that may include CPU and other chip sets. The connection between the motherboard and the flash memory module 170 is through an internal bus such as a Peripheral Component Interconnect Express (PCI-E).

Figure 1E:
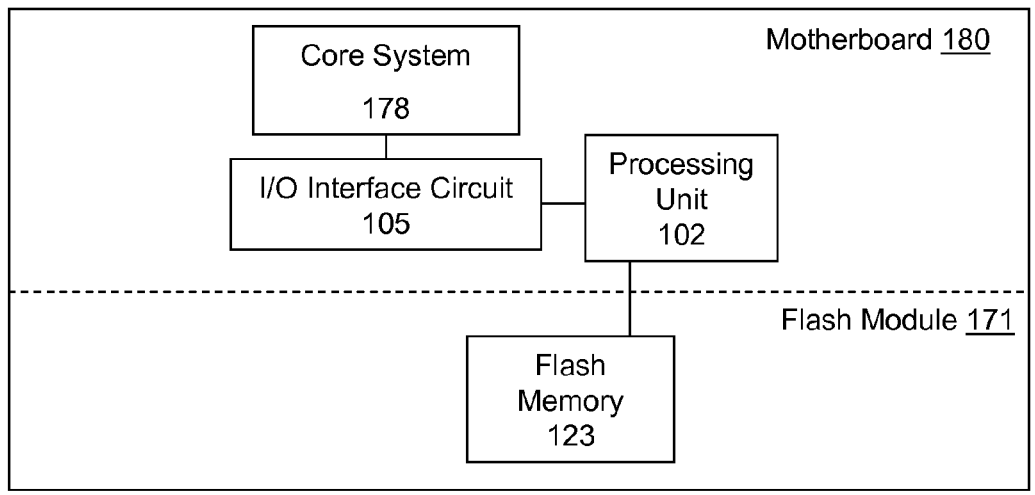
FIG. 1E is a block diagram showing salient components of a flash memory module without a controller, the flash memory module couples to a motherboard, in which an embodiment of the present invention may be implemented.

Another flash memory module 171 is shown in FIG. 1E. The device 171 comprised only flash memory chips or integrated circuits 123. Processing unit 102 (e.g., a non-volatile memory controller) and I/O interface circuit 105 are built onto a motherboard 180 along with a core system 178 (i.e., a CPU and other chip sets). In a slight alternative embodiment, the processing unit 102 may be included in the CPU of the core system 178.

Figure 2:
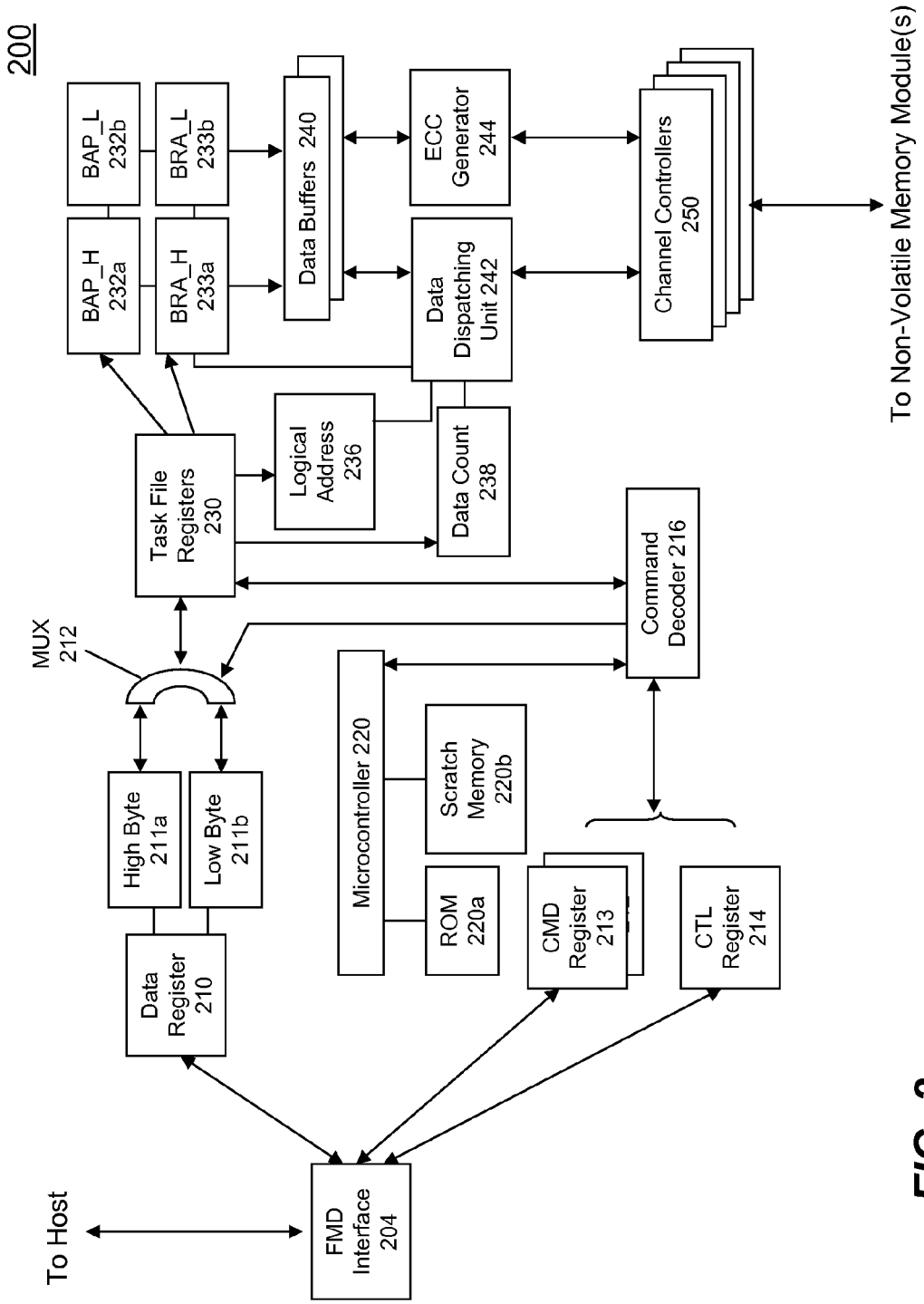
FIG. 2 is a functional block diagram depicting an exemplary high performance non-volatile memory device controller in accordance with one embodiment of the present invention.

FIG. 2 is a block diagram illustrating an exemplary NVMD controller in accordance with one embodiment of the present invention. The NVMD controller 200 comprises a NVMD interface 204, a data register 210, one or more command (CMD) registers 213, a control (CTL) register 214, a multiplexer (MUX) 212, a microcontroller 220 (e.g., a 8051 microcontroller), a command decoder 216, task file registers 230, a set of parallel data buffers 240 (e.g., a pair of data buffers), a data dispatching unit 242, an error correction code (ECC) generator 244 and a plurality of channel controllers 250. The NVMD interface 204 is configured to provide data, command and control signals interface to and from a host computer system. When the data register 210 is sized to hold two-byte of data (i.e., high and low bytes), the high byte and low byte are separated in a high byte filter 211a and a low byte filter 211b. The high byte and the low byte are multiplexed together in a multiplexer 212 for data to be written to the NVMD. For data to be read or retrieved from the NVMD, the data flow is reversed, the data register 210 is filled with high and low bytes of the data from the multiplexer 212.

The command decoder 216 is configured to decode commands and control signals received in the CMD registers 213 and the CTL register 214, respectively. The decoded commands and control signals are sent to the multiplexer 212 before sending to the task file registers 230. The command decoder 216 is also configured to communicate with the microprocessor 220 and the task file registers. The microcontroller 220 further includes a read-only memory (ROM) 220a and a scratch memory 220b (e.g., a random access memory (RAM)). The ROM 220a is configured to store modules (e.g., firmware) to be executed by the microprocessor 220. The scratch memory 220b is configured as a main memory space when one of the modules is executed in the microcontroller 220. The task file registers 230 is configured to extract decoded data, command and control signals. The extracted data include, but is not necessarily limited to, logical address 236 (e.g., logical block address (LBA) or logical sector address (LSA)), data count 238, buffer address pointer (i.e., BAP_H 232a high byte of the pointer and BAP_L 232b low byte of the pointer) and corresponding data (i.e., BRA_H 233a high byte of the data and BRA_L 233b low byte of the data). The data dispatching unit 242 uses the extracted data (i.e., the buffer address pointer and the corresponding data) to fill the set of parallel data buffers 240 in a specific interleaving scheme. The ECC generator 244 is configured to generate ECC for the filled data in the data buffers 240 before being written to the at least one non-volatile memory module. The channel controllers 250 is configured to transmit data between the set of data buffers 240 and the at least one non-volatile memory module in a most efficient manner.

Figure 3A:
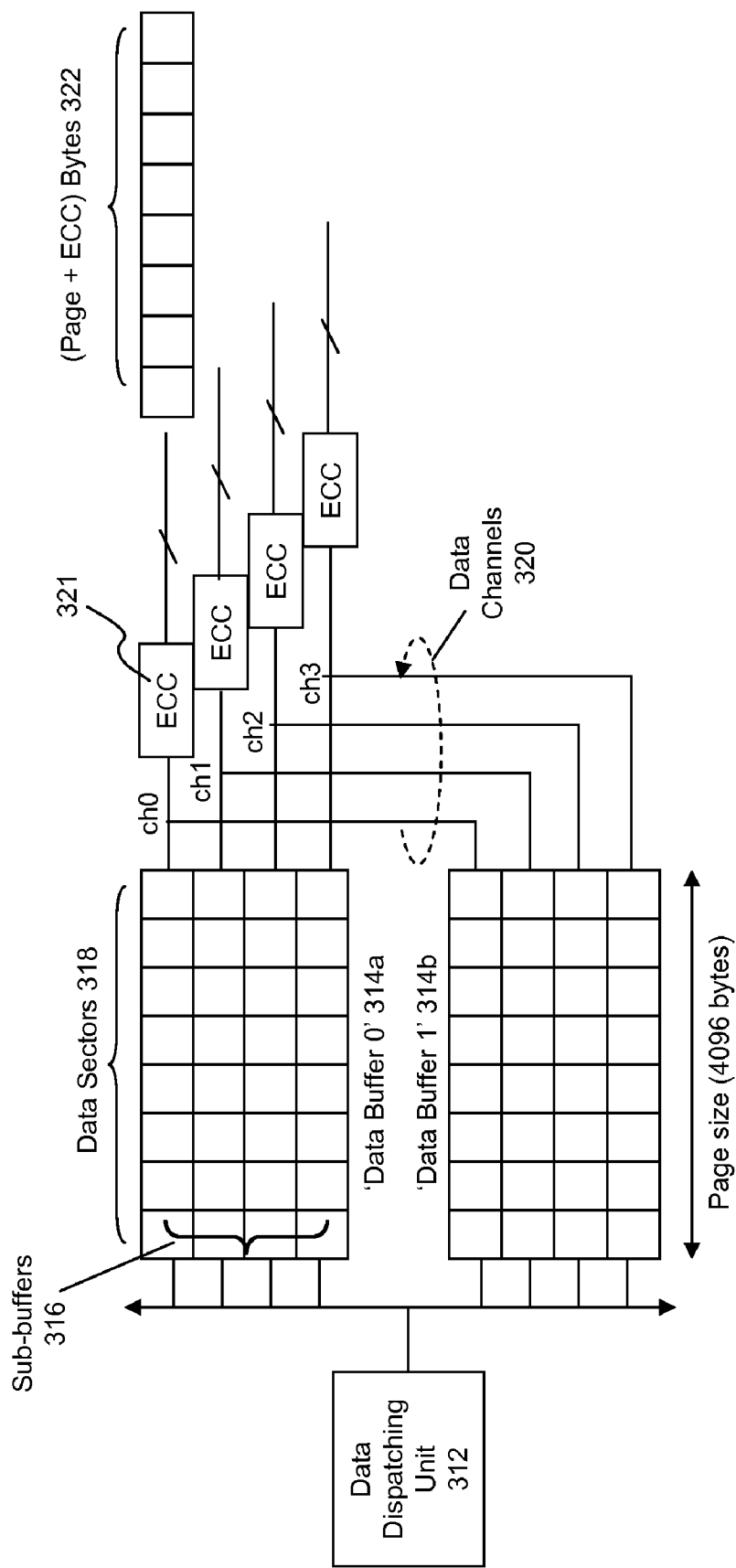
FIGS. 3A-3B are schematic diagrams showing exemplary error correction code (ECC) data structures used in data buffers of the NVMD controller of FIG. 2, according to an embodiment of the present invention.
Figure 3B:
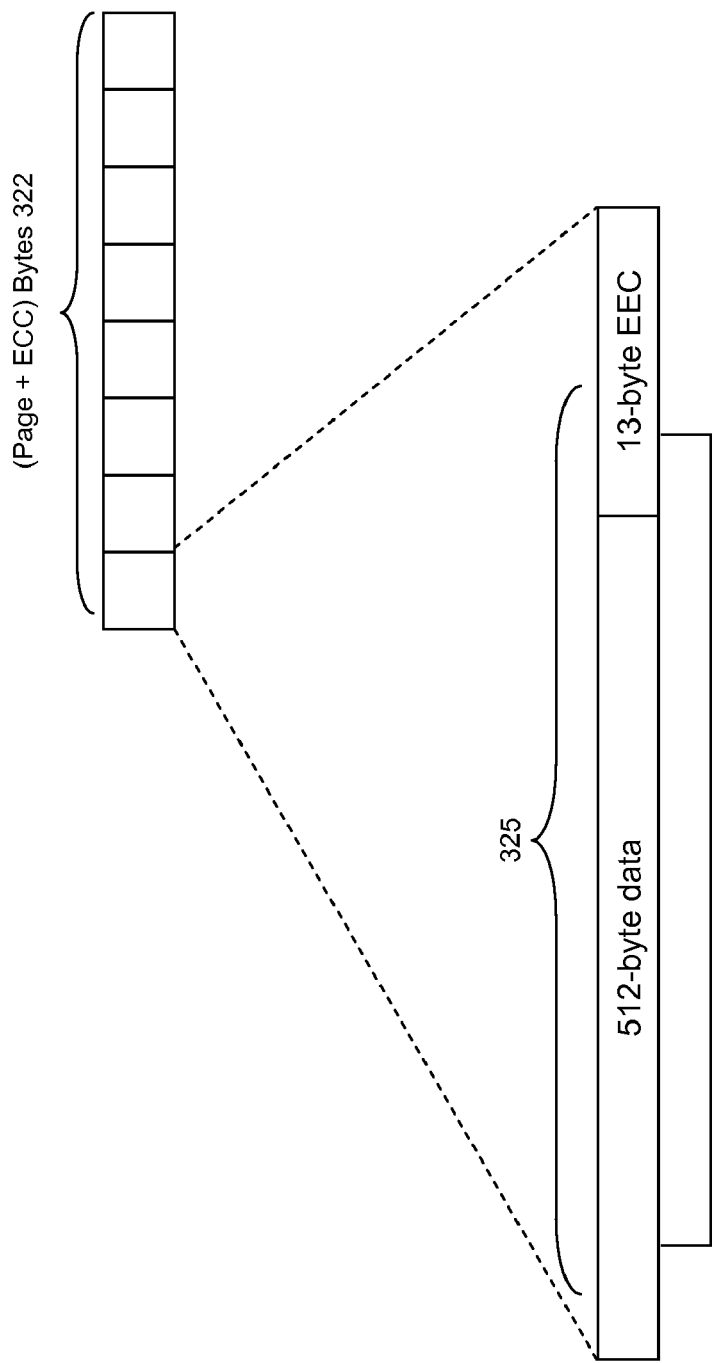

In order to increase data reliability, data stored on the at least one non-volatile memory module are protected using certain error correction techniques. One of the error correction techniques is referred to as ECC (either "error correction (or correcting) code" or "error checking and correcting". There are many types of ECC. In general, a code (i.e., an ECC) is first created for original data (e.g., filled data in the data buffers before being written or programmed) using one of the ECC algorithms (e.g., Reed-Solomon, Hamming, Reed-Muller, Binary Golay, BCH (Bose, Ray-Chaudhuri, Hocquenghem), etc.). Later, during a data reading or retrieval, the code is used for reconstructing the original data if any error is detected. FIG. 3A is a schematic diagram showing an exemplary ECC data structure used in the set of parallel data buffers of the NVMD controller of FIG. 2, according to an embodiment of the present invention.

In a data writing operation, a data dispatching unit 312 (i.e., the data dispatching unit 242 of FIG. 2) fills data to a set of parallel data buffers (e.g., 'data buffer 0' 314a and 'data buffer 1' 314b). Each data buffer is divided into a plurality of sub-buffers 316 (e.g., four shown). Each sub-buffer has a size equal to page size (e.g., 4096 bytes in this example) of the non-volatile memory chip. And each sub-buffer may be further partitioned into one or more data sectors 318 (e.g., eight shown). Respective sub-buffers are connected to one of corresponding data channels 320 (e.g., four channels ch0, ch1, ch2, ch3). For example, a first pair of sub-buffers (i.e., first sub-buffer from 'data buffer 0' 314a and first sub-buffer from 'data buffer 1' 314b) is connected to first data channel (ch0).

An error correction code or ECC 321 is generated for original data in each of the sub-buffers 316 with an ECC generator (i.e., ECC generator 244 of FIG. 2). The generated ECC 321 is appended to the original data as an ECC page 322 (i.e., a data segment containing (Page+ECC) bytes) and written to a register in one of the planes of a non-volatile memory chip in the at least one non-volatile memory module. In the example shown in FIG. 3A, there are eight data sectors 318 per sub-buffer 316. Each sub-buffer 316 contains 4096 bytes of data hence 512 bytes for each data sector 318. Depending on types of ECC used, storage requirements may vary. For example, FIG. 3C is a blown-up view 325 illustrating a 13-byte ECC based on BCH for a 512-byte data sector.

BCH code is a linear, multilevel, cyclic, error-correcting, variable-length digital code used to correct multiple random error patterns. BCH code is a polynomial code over a finite field with a particular chosen generator polynomial. A binary BCH code contains binary sequences of length $2^m-1$ with roots including 2t consecutive powers of the primitive element of finite field or Galois field $GF(2^m)$. The above BCH code is denoted as BCH(n,k,t) and has the following properties:

Block length: $n=2^m-1$
Information length: k
Max. number of correctable errors: t
Max. number of detectable errors: 2t
Parity Check Bits: $n-k \leq mt$
Minimum distance: $d \geq 2t+1$ An example of sixteen elements of $GF(2^4)$ or GF(16) generated by a generator polynomial $(x^4+x+1)$ is listed in FIG. 4A. Sixteen elements of GF(16) are listed in three columns represented in form of power, polynomial and binary, respectively. The power form expresses the reality that each field element except zero is the power of the generating element, $\alpha$, and is useful when multiplying field elements. The polynomial form is useful for adding field elements, and the binary form contains binary values of the coefficients of corresponding polynomial, with the highest power of $\alpha$ on the left. FIG. 4B shows elements of GF(16) generated by $(x^4+x^3+1)$. It is noted that the elements in FIG. 4B are the same as those in FIG. 4A except in different order. The generator polynomials $(x^4+x+1)$ and $(x^4+x^3+1)$ are also primitive polynomial functions in BCH codes.

FIG. 4C shows a list of eight primitive polynomials of $GF(2^{13})$. BCH codes created with primitive polynomials can only correct one random error in the code. In order to correct more than one random error, the generator polynomial is created based on desired numbers of correctable random errors. For example, a generator polynomial with 23 terms and highest power 52 shown in FIG. 4D is used for correcting up to 4 random errors in $GF(2^{13})$. For eight (8) correctable errors, the generator polynomial contains 49 terms with highest power 104 as shown in FIG. 4E. It can be seen that the highest power of the generator polynomial is equal to (m×t), for example, highest rank of 104 is the result of multiplying m=13 with t=8 in FIG. 4E.

Figure 5A:
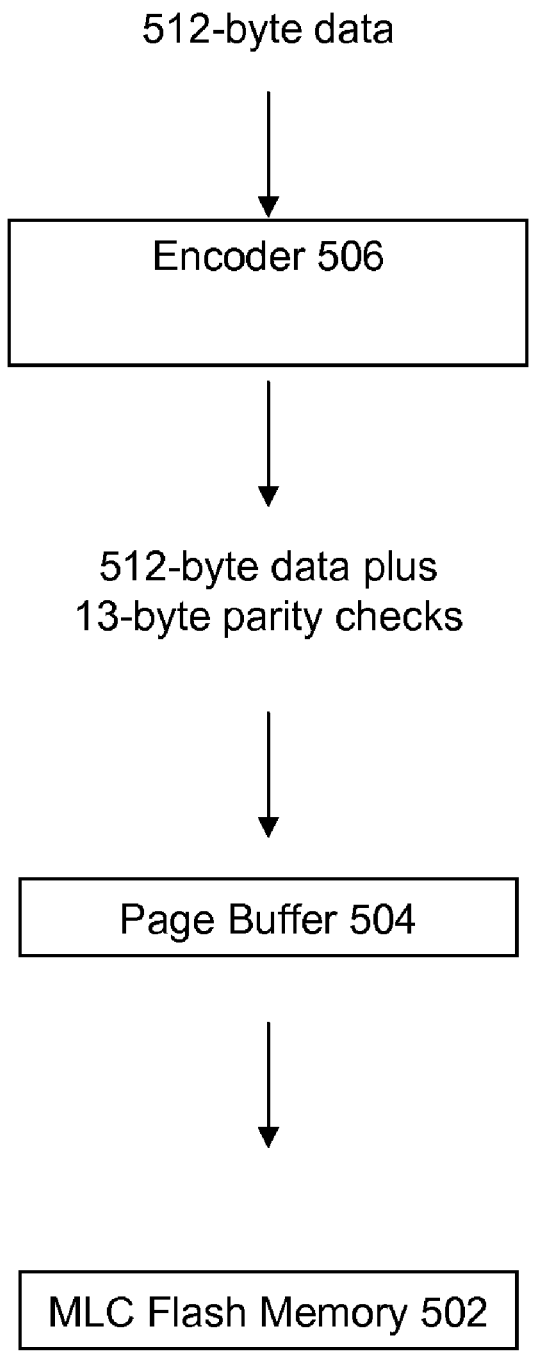
FIG. 5A is a block diagram showing an exemplary encoder in an error corrector of the NVMD control of FIG. 2, according to one embodiment of the present invention.

FIG. 5A is a diagram showing an exemplary ECC encoder 506 in an error corrector of the NVMD in FIG. 2, according to one embodiment of the present invention. An encoder 506 is configured for encoding a chunk of data (e.g., 512-byte sector) to a codeword (e.g., 525-byte data plus ECC or parity checks) using the generator polynomial of FIG. 4E. Using bit as unit, the BCH code created in encoder 506 is denoted as BCH (4200,4096,8) or BCH code having a 4200-bit codeword with 4096 information bits and capable of correcting up to 8 random error bits. Upon creation, the codeword is stored into a page buffer 504 then to the non-volatile memory (e.g., MLC flash memory 502).

Figure 5B:
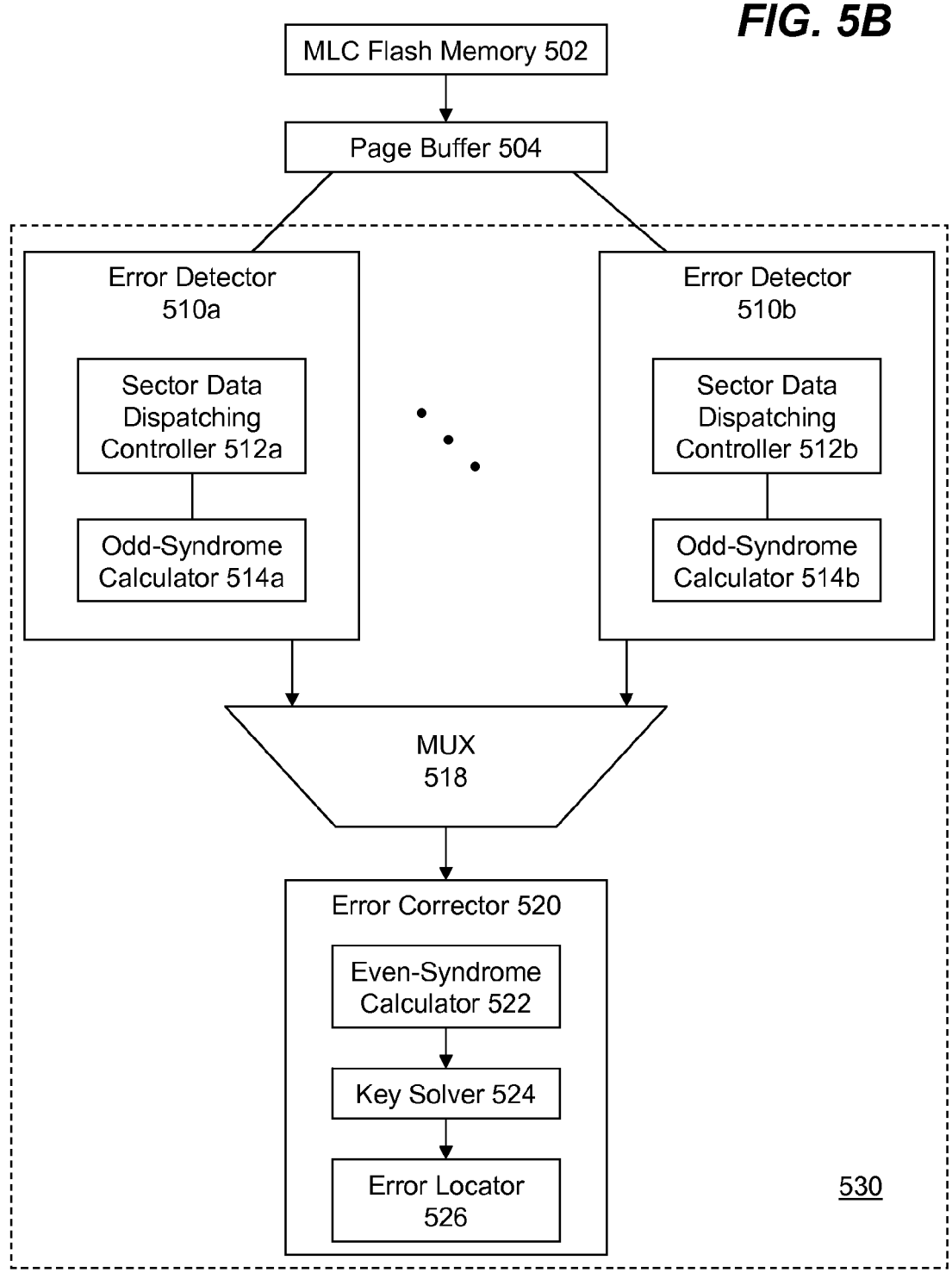
FIG. 5B is a block diagram showing an exemplary decoder in an error corrector of the NVMD control of FIG. 2, according to one embodiment of the present invention

FIG. 5B is a diagram showing an exemplary decoder 530 in an error corrector of the NVMD in FIG. 2, according to one embodiment of the present invention. The error decoder 530 comprises a plurality of data error detectors 510a-b and an error corrector 520, which is coupled to the data error detectors 510a-b with a multiplexer (MUX) 518. Each data error detector 510a-b is configured to process a chunk of data (e.g., 512-byte data sector). In one embodiment, four error correctors 510 are included so that each of the data sectors in a data page can be processed in parallel. The data error detector 510 comprises a sector data dispatching controller 512 and an odd-syndrome calculator 514. The sector data dispatching controller 512 is configured for receiving appropriate data sector, while the odd-syndrome calculator 514 for computing the odd terms of syndrome polynomial of the received codeword. If the data error detectors 510a-b determine that there is no error in the received data, the error corrector would stop processing further and move on to the next chunk of data.

If, however, data error detectors 510a-b have detected data error in the received data, the error corrector 520 is configured to process additional error location and correction. There is only one error corrector 520 for the set of data error detectors 510a-b. The error corrector 520 comprises an even-syndrome calculator 522, a key equation solver 524 and an error locator 526. Process in the error corrector 520 is conducted sequentially in contrast to parallel processing in the data error detectors 510a-b. The even-syndrome calculator 522 is configured to derive even terms of syndrome polynomial from the previously calculated corresponding terms. In BCH codes, an even term of the syndrome polynomial can be obtained from a corresponding term using a relatively straightforward procedure (e.g., $S_{2j}=(S_j)^2$, for j=1, 3, 5, ..., 2t−1). The key solver 524 is configured for determining coefficients of error polynomial based on the terms of syndrome polynomial of the codeword. One exemplary key solver is based on an iterative procedure by Berlekamp-Massey. The error locator 526 is configured for determining the location or locations of the random errors and for correcting the error or errors accordingly. An exemplary error locator is based on Chien search logic.

Because syndrome polynomial of a codeword is the remainder of the codeword divided by the generator polynomial, the terms of syndrome polynomial can be computed with a substantially similar logic used for encoding. Therefore, parallel encoding and error detection is possible and thus improving the efficiency.

Figure 6:
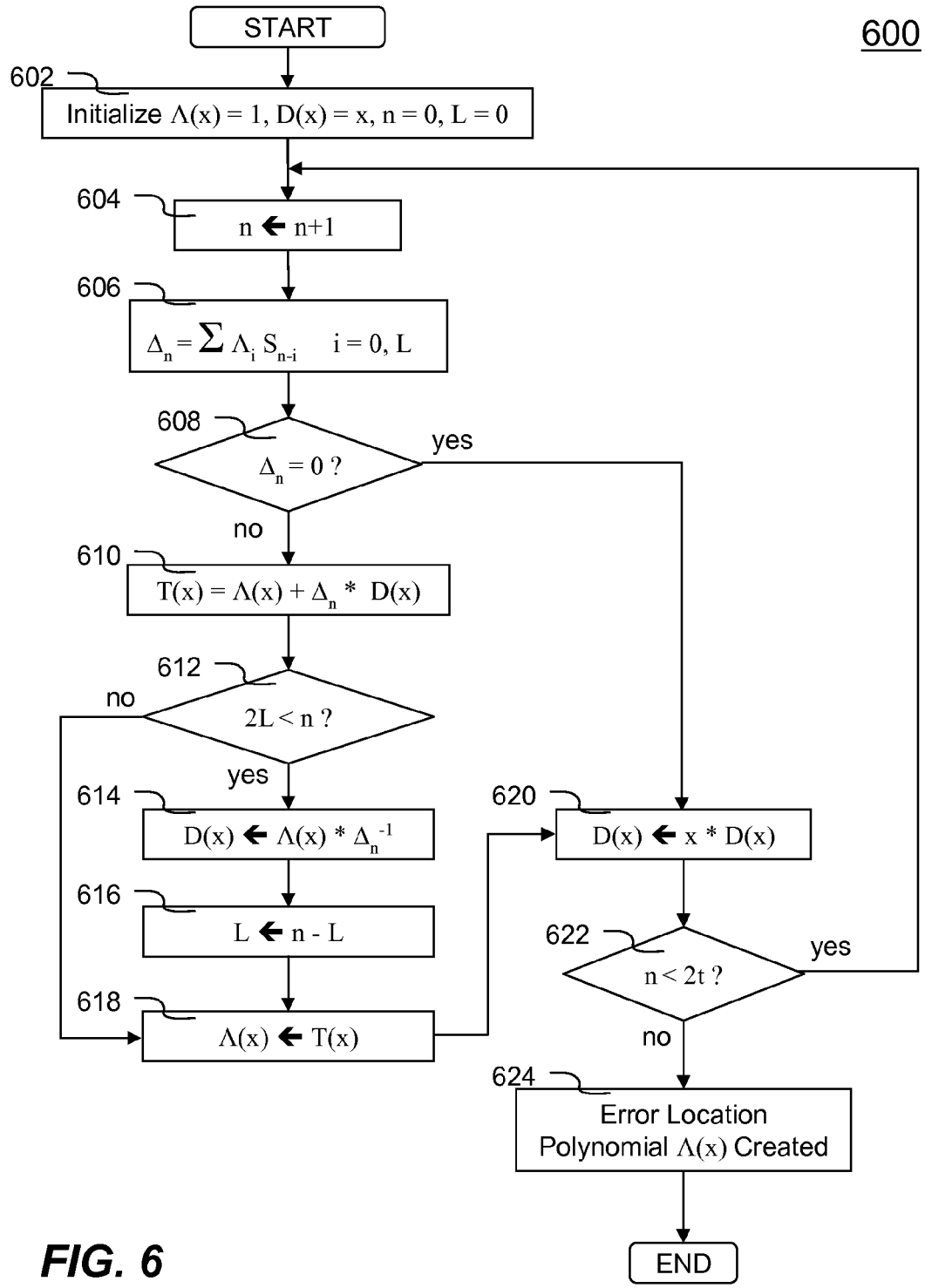
FIG. 6 is a flowchart illustrating a process of Berlekamp-Massey iterative approach with inversion.

As for the key solver 524, there are a number of schemes to accomplish. First, shown in FIG. 6, is a flowchart for a standard Berlekamp-Massey iterative process 600 with inversion. Process 600 starts by initializing error location polynomial $\Lambda(x)$ to 1 (one), function D(x) to 'x', and integer variables 'n' and 'l' to 0 (zero) at step 602. Next, at step 604, variable 'n' is incremented by 1 (one). An intermediate quantity $\Delta_n$ is then calculated at step 606 using Equation (1):

$$\Delta_n = \sum_{i=0}^{L} \Lambda_i S_{n-i} \quad (1)$$

Then, the process 600 moves to decision 608, it is determined whether $\Delta_n$ is equal to 0 (zero). If 'yes', process 600 moves to step 620. D(x) is assigned the value of D(x) multiplied by 'x'. Otherwise if 'no', a temporary polynomial T(x) is calculated using Equation (2) at step 610.

$$T(x)=\Lambda(x)+\Delta_n*D(x) \quad (2)$$

Process 600 moves to decision 612, it is determined whether variable 'n' is less than '2L' (i.e., variable 'L' times 2 (two)). If 'no', the error polynomial $\Lambda(x)$ is assigned the value of temporary polynomial T(x) at step 618. Otherwise, process 600 moves to step 614, in which D(x) is assigned the value of $\Lambda(x)$ multiplied by an inversion of $\Lambda_n$. At step 616, variable 'L' is assigned value of 'n-L' before moving to step 618. Then process 600 moves to step 620.

Next, at decision 622, variable 'n' is checked against '2t' (i.e., max. number of errors BCH code capable of detecting). If 'yes', process 600 moves back to step 604 incrementing variable 'n' for another iteration. Otherwise, process 600 ends after step 624, in which the error polynomial $\Lambda(x)$ is formed. It is noted that the inversion of $\Lambda_n$ is difficult and expensive to calculate thus making process 600 impractical.

Figure 7:
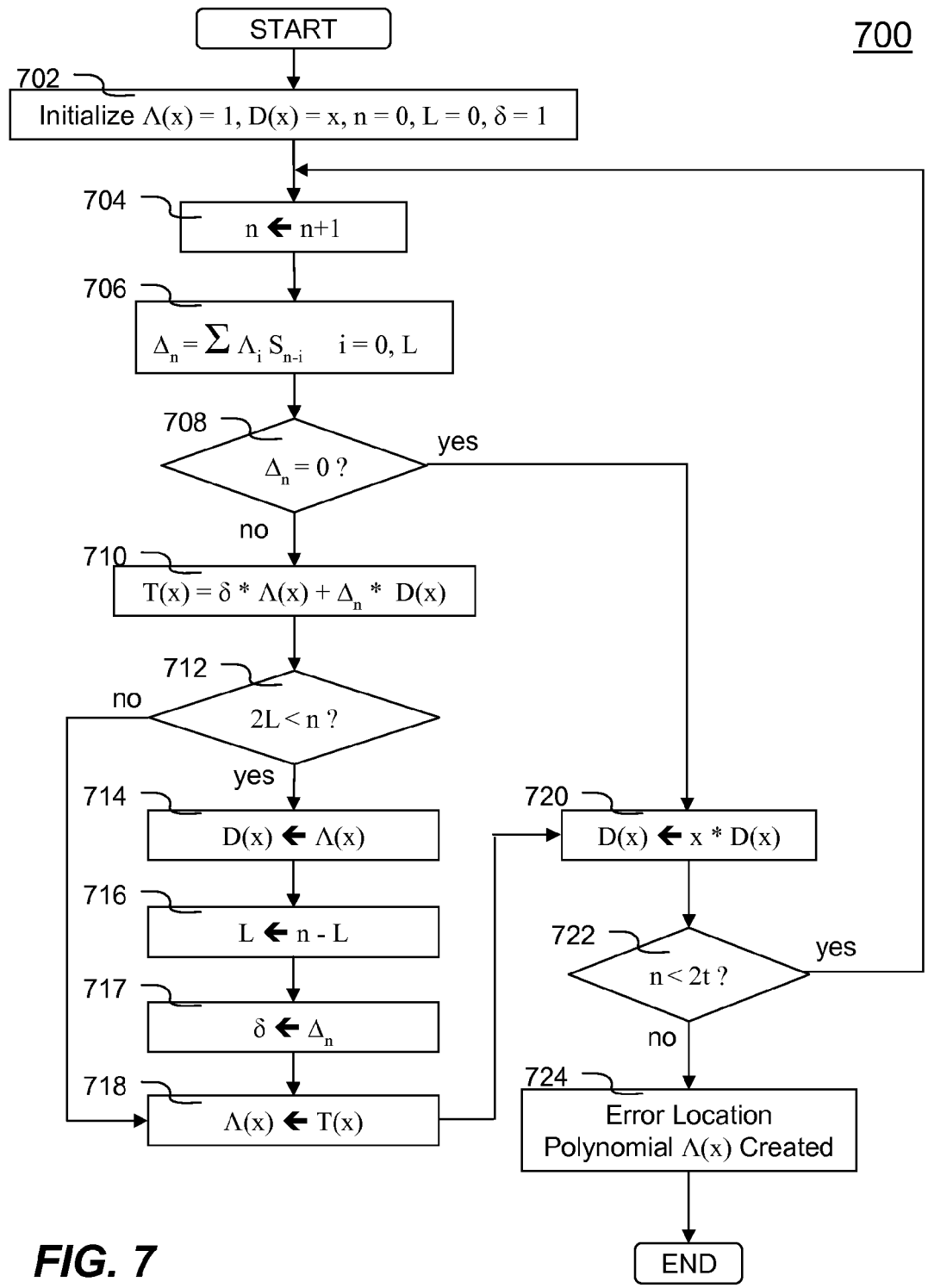
FIG. 7 is a flowchart illustrating a process of another Berlekamp-Massey iterative approach without inversion with full loop count.

Referring now to FIG. 7, which is a flowchart illustrating a second process 700 of key solver based on Berlekamp-Massey iterative approach without inversion with full loop count. Process 700 may be implemented in software, hardware or a combination of both. Process 700 is very similar to process 600. The difference is without inversion instead an additional variable '$\delta$' is used.

Process 700 starts by initializing error location polynomial $\Lambda(x)$ to 1 (one), function D(x) to 'x', and integer variables 'n' and 'L' to 0 (zero), and '$\delta$' to 1 (one) at step 702. At step 704, variable 'n' is incremented by 1 (one). Next, intermediate quantity $\Delta_n$ is calculated at step 706 using Equation (1). At decision 708, $\Delta_n$ is checked against 0 (zero). If 'yes', process 700 moves to step 720, in which D(x) is assigned the value of D(x) multiplied by 'x'. Otherwise, process 700 moves to step 710. A temporary polynomial T(x) is calculated using Equation (3).

$$T(x)=\delta*\Lambda(x)+\Delta_n*D(x) \quad (3)$$

Process 700 then moves to decision 712 to determine whether variable 'n' is greater than '2L'. If 'not', the error polynomial $\Lambda(x)$ is assigned the value of temporary polynomial T(x) at step 718. Otherwise, process 700 moves to step 714, in which D(x) is assigned the value of $\Lambda(x)$. At step 716, variable 'L' is assigned value of 'n-L'. Variable '$\delta$' is assigned to value of $\Delta_n$ before moving to step 718. Then process 700 moves to step 720. Next at decision 722, process 700 determines whether variable 'n' is less than '2t'. If 'yes', process 700 moves back to step 704 incrementing variable 'n' for another iteration. Otherwise, process 700 ends after step 724, in which the error polynomial $\Lambda(x)$ is formed.

Figure 8:
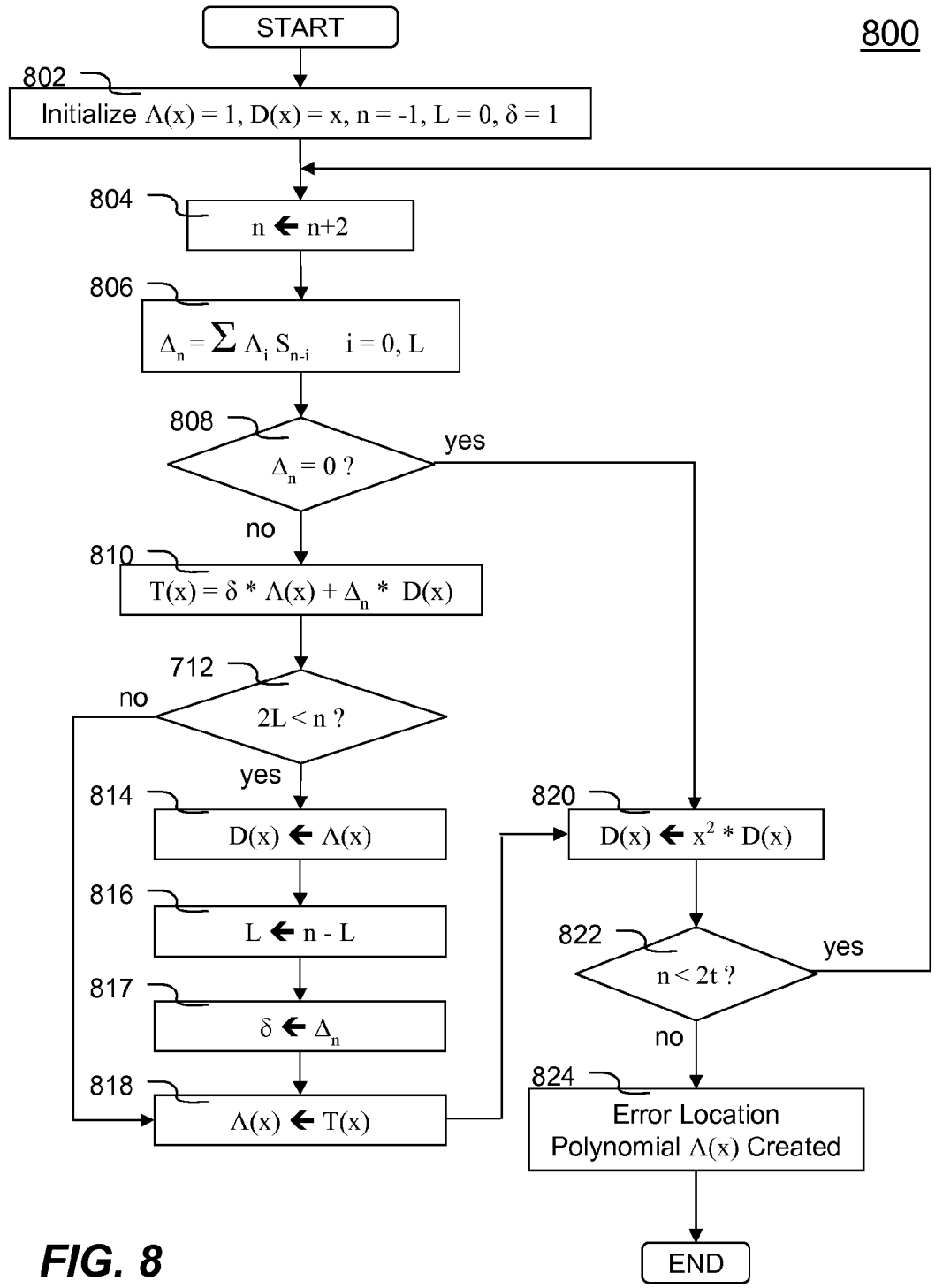
FIG. 8 is a flowchart illustrating a process of yet another Berlekamp-Massey iterative approach without inversion with half loop count.

Referring now to FIG. 8, a flowchart illustrating a third process 800 of key solver based on Berlekamp-Massey iterative approach without inversion with half loop count. Process 800 may be implemented in software, hardware or a combination of both. Process 800 is substantially similar to process 700. The difference is that the increment is doubled hence reducing loop count to half.

Differences are as follows: (1) initial value of variable 'n' is set to '−1' at step 802; (2) the increment of variable 'n' is 2 (two) at step 804; and D(x) is assigned the value of D(x) multiplied by '$x^2$' at step 820. Examples for comparing process 700 and process 800 are shown in FIG. 9 and FIG. 10, respectively.

In both examples, BCH(15,7,2) code with two errors are used. The syndrome of received data in a polynomial form is $S(x)=\alpha^{11}x^4+\alpha^5x^3+\alpha^{13}x^2+\alpha^{14}x$. In FIG. 9, a table 900 summarizes every iteration of the full loop count case is shown. In table 900, columns list values of variables and polynomials 'n', 'L', '$\delta$', $\Lambda(x)$, D(x), $\Delta_n$, and T(x), while rows represent iterations. For example, the initial values are shown in row with 'n' equal to 0 (zero), 'L' to 0, '$\delta$' to 1, $\Lambda(x)$ to 1 and D(x) to 'x'. Following the flowchart in FIG. 7, 'n' is incremented to 1 and $\Delta_1$ is calculated as $\alpha^{14}$ and T(x) as $(1+\alpha^{14})$ in the row after. Then D(x) is assigned value of $\Lambda(x)$ and $\Lambda(x)$ value of T(x), '$\delta$' value of $\Delta_1$, and 'L' is assigned valued of 'n-L'. Finally, D(x) is multiplied by 'x' before 'n' is incremented to 2 (two). $\Delta_2$ is then calculated as 0. Therefore, only D(x) is multiplied by 'x' to become '$x^2$' as the last update in this iteration. 'n' is then incremented to 3 (three). Similar calculations continue until 'n' is incremented to 4 (four). The resulting error location polynomial $\Lambda(x)=\alpha^{14}+\alpha^{13}x+\alpha^{14}x^2$.

FIG. 10 shows a table 1000 summarizing computations based on the third process 800 (half loop count Berlekamp-Massey) of FIG. 8. Using the same BCH (15,7,2) code and syndrome of $S(x)=\alpha^{11}x^4+\alpha^5x^3+\alpha^{13}x^2+\alpha^{14}x$. It is evident that the computations are more efficient based on the process 800.

Figure 11:
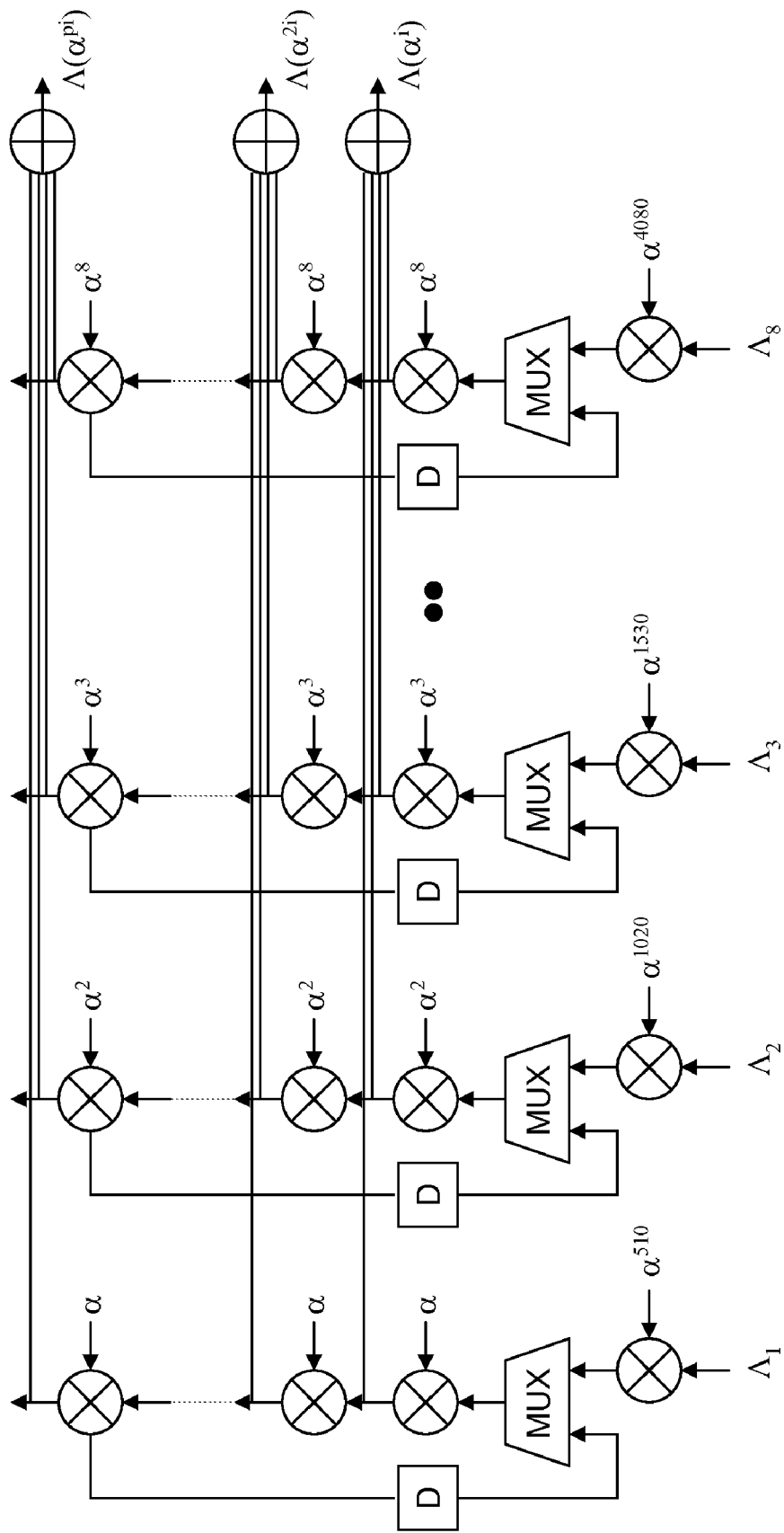
FIG. 11 is a diagram showing an exemplary error locator based on parallel implementation of Chien search, according to one embodiment of the invention.

After the error location polynomial has been determined in the key solver, the next stage of error correction is to locate random errors and correct them accordingly. The Chien search has been used here. Referring now to FIG. 11, which is a diagram showing an exemplary error locator 1100 based on parallel implementation of Chien search. The error locator 1100 comprises 'p' sets of parallel logic or circuits such that the sequential Chien search can be conducted in a 'p'-way parallel computation. In a BCH(4200,4096,8) code, there are eight terms in the error polynomial shown as $\Lambda_1, \Lambda_2, \Lambda_3, \Lambda_4, \Lambda_5, \Lambda_6, \Lambda_7$, and $\Lambda_8$. Each of the eight terms is multiplied by $\alpha$, $\alpha^2, \alpha^3, \alpha^4, \alpha^5, \alpha^6, \alpha^7$, and $\alpha^8$ respectively. With 'p'-way parallelism, 'p' sets of computation can be performed simultaneously.

Figure 12A:
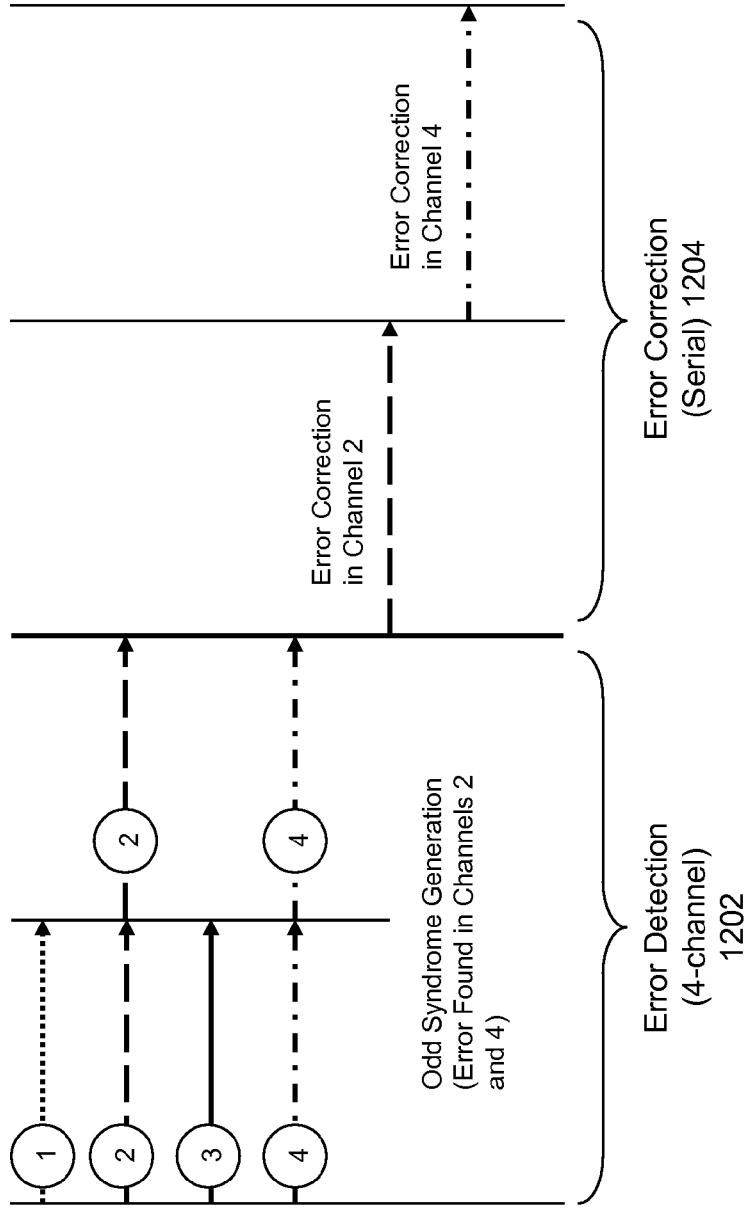
FIGS. 12A-B show timing diagrams of decoding using decoder of FIG. 5B.
Figure 12B:
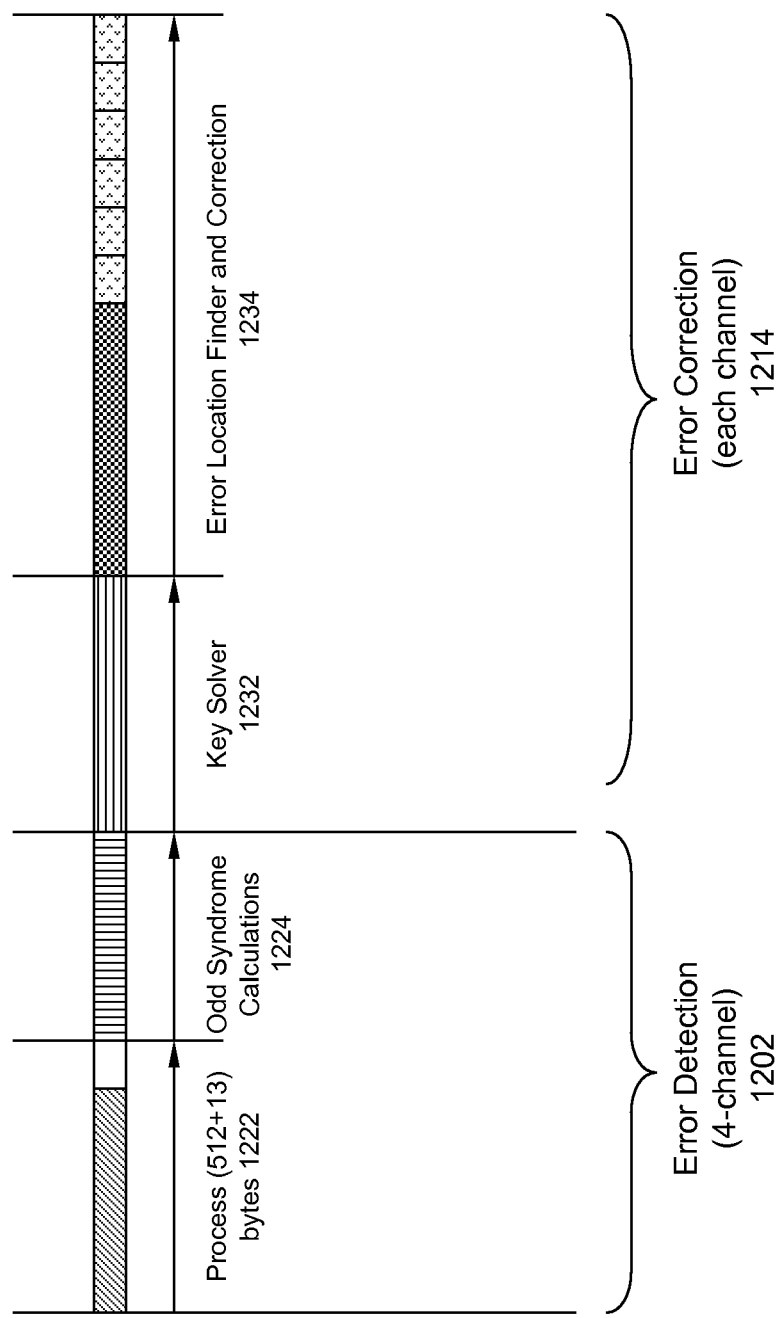

FIGS. 12A-12B are timing diagrams showing an exemplary error detection and correction using the decoder of FIG. 5B. In timing diagram 1200, error detection 1202 is performed with four-channel in parallel. As indicated in FIG. 5B, only odd terms of the syndrome polynomial are calculated. In this example, channels 2 and 4 are found containing random errors. These two channels need to process further to perform error correction 1204, which is conducted in serial.

Timing diagram 1220 shows a more detailed view of the timing diagram 1200. First portion 1222 of error detection 1202 includes the time required for processing a codeword (e.g., a 525-byte codeword including 512-byte data plus 13-byte parity checks). Second portion 1224 is the time needed for calculating odd terms of syndrome polynomial (e.g., $S_1, S_3, S_5$ and $S_7$ are required for eight errors). If there is no error found in any one of the parallel channels, there is no need to perform error correction. However, if an error is detected in a particular channel, data correction needs to be conducted in that channel to actually locate and correct the error. When there are multiple channels need to be corrected, the process is performed sequentially one channel at a time. The time line 1214 shown in diagram 1220 is for one particular channel. Error correction time 1214 is further divided into two portions: time spent in key solver (e.g., inversion-less Berlekamp-Massey with half loop count), and in error location and correction (e.g., 'p'-way parallel Chien search).

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present invention also relate to an apparatus for performing the operations herein. This apparatus may be specially constructed for the required purposes, or it may comprise a general-purpose computer selectively activated or reconfigured by a computer program stored in the computer. Such a computer program may be stored in a computer readable medium. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., carrier waves, infrared signals, digital signals, etc.)), etc.

The algorithms and displays presented herein are not inherently related to any particular computer or other apparatus. Various general-purpose systems may be used with programs in accordance with the teachings herein, or it may prove convenient to construct more specialized apparatus to perform the required method operations. The required structure for a variety of these systems will appear from the description below. In addition, embodiments of the present invention are not described with reference to any particular programming language. It will be appreciated that a variety of programming languages may be used to implement the teachings of embodiments of the invention as described herein.

Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas BCH code has been shown and described using BCH(4200, 4096,8) in $GF(2^{13})$, other BCH codes may be used, for example, BCH(4198,4096,4) in $GF(2^{13})$ for maximum of four random data errors. Additionally, whereas a Secure Digital (SD) card interface has been shown and described, other types of connectors such as a Multi-Media Card (MMC) interface circuit, a micro Secure Digital (μSD) interface, an embedded SD interface, a Compact Flash (CF) interface circuit, a Memory Stick (MS) interface circuit, a PCI-Express interface circuit, an Integrated Drive Electronics (IDE) interface circuit, a Serial Advanced Technology Attachment (SATA) interface circuit, an external SATA interface circuit, a Radio Frequency Identification (RFID) interface circuit, a fiber channel interface circuit, and an optical connection interface circuit may be used to achieve the same function. Moreover, whereas the microcontroller and non-volatile memory have been shown as two separate objects, the microcontroller and the non-volatile memory could be implemented in different forms such as a single chip, single substrate, single chip carrier, single die on a wafer or a single chip scaled package. Furthermore, whereas the size of the data area of a page has been shown to hold four sectors of 512-byte, a page holds other number of sectors such as eight may be used. Furthermore, a page size of 4096-byte has been described, other page sizes could be substituted such as 512-, 1024-, 2048-byte, etc. Flash blocks may include 4, 8, 16, 32, 64 pages or other numbers, depending upon the physical flash chips and arrangement used. In summary, the scope of the invention should not be restricted to the specific exemplary embodiments disclosed herein, and all modifications that are readily suggested to those of ordinary skill in the art should be included within the spirit and purview of this application and scope of the appended claims.

We claim:

1. A system for performing data error correction in a non-volatile memory device comprising:
   a plurality of data error detectors each containing an odd-syndrome calculator, wherein the odd-syndrome calculator is configured for calculating odd terms of syndrome polynomial of a codeword;
   at least one data encoder configured for encoding a chunk of data based on a predetermined coding scheme of (Bose, Ray-Chaudhuri, Hocquenghem) BCH (4200, 4096, 8) code including a 4200-bit codeword with 4096-bit information data and up to eight (8) random correctible data errors;
   a multiplexer coupling to the plurality of data error detectors; and
   a data error corrector, coupling to the multiplexer, comprising an even-syndrome calculator, a key-solver and an error locator, wherein the even-syndrome calculator is configured for calculating even terms of the syndrome polynomial, wherein the key solver is configured for determining coefficients of error polynomial based on the odd and even terms of the syndrome polynomial, and wherein the error locator is configured for finding one or more locations of random data error using the coefficients of error location polynomial.

2. The system of claim 1, wherein the at least one data encoder encodes the chunk of data using a generator polynomial in Galois Field $GF(2^{13})$.

3. The system of claim 2, wherein the chunk of data comprises a data sector of 512-byte.

4. The system of claim 3, wherein the codeword includes the data sector plus parity checks of 13-byte.

5. The system of claim 4, wherein the generator polynomial is created based on maximum eight random data errors.

6. The system of claim 1, wherein the odd and even terms of the syndrome polynomial are calculated based on maximum number of random data errors configured in the BCH code.

7. The system of claim 1, wherein the plurality of data error detectors is configured to perform calculations in parallel, and the data error corrector in serial.

8. The system of claim 1, wherein the key solver is based on inversion-less Berlekamp-Massey with half loop count iterative process.

9. The system of claim 1, wherein the error locator is based on 'p'-way parallel Chien search, where 'p' is a positive integer.

10. The system of claim 1, wherein a plurality of data error detectors comprises four symmetrical data error detectors.

11. A method of performing data error correction in a non-volatile memory device comprising:
    receiving a plurality of codewords each encoded with a predetermined coding scheme of (Bose, Ray-Chaudhuri, Hocquenghem) BCH (4200, 4096, 8) code including a 4200-bit codeword with 4096-bit information data and up to eight (8) random correctible data errors;
    calculating odd terms of syndrome polynomial of each of the codewords in parallel;
    determining whether said each of the codewords contains any data error;
    when said data error is found,
        sequentially calculating even terms of the syndrome polynomial corresponding to the odd terms of those of the codewords containing said data error;
        iteratively obtaining coefficients of error polynomial using the odd and even terms of the syndrome polynomial;
        locating at least one random error location in each of said those of the codewords containing said data error using Chien search logic; and
        correcting data error at the at least one random error location accordingly.

12. The method of claim 11, wherein the BCH (4200, 4096, 8) is created in a Galois Field $GF(2^{13})$ with a generator polynomial.

13. The method of claim 12, wherein the generator polynomial comprises 49 terms represented as follows:

$$1+x+x^5+x^8+x^9+x^{11}+x^{12}+x^{13}+x^{14}+x^{15}+x^{18}+x^{22}+x^{23}+ \\ x^{24}+x^{26}+x^{30}+x^{31}+x^{32}+x^{38}+x^{40}+x^{41}+x^{42}+x^{47}+ \\ x^{48}+x^{49}+x^{52}+x^{58}+x^{59}+x^{64}+x^{65}+x^{67}+x^{68}+x^{69}+ \\ x^{70}+x^{77}+x^{78}+x^{79}+x^{82}+x^{84}+x^{88}+x^{91}+x^{92}+x^{93}+ \\ x^{94}+x^{95}+x^{96}+x^{98}+x^{100}+x^{104}.$$

14. The method of claim 13, wherein both the odd and even terms of the syndrome polynomial are calculated using the generator polynomial.

15. The method of claim 11, wherein the key solver is based on inversion-less Berlekamp-Massey iterative procedure with half loop count.

16. The method of claim 11, wherein the Chien search logic comprises a 'p'-way parallel logic, where 'p' is a positive interger.

* * * * *